(12) United States Patent
Schmidt

(10) Patent No.: US 7,951,676 B2
(45) Date of Patent: May 31, 2011

(54) SEMICONDUCTOR DEVICE AND METHOD FOR THE PRODUCTION OF A SEMICONDUCTOR DEVICE

(75) Inventor: Gerhard Schmidt, Wernberg-Wudmath (AT)

(73) Assignee: Infineon Technologies AG, Neubiberg (DE)

( * ) Notice: Subject to any disclaimer, the term of this patent is extended or adjusted under 35 U.S.C. 154(b) by 454 days.

(21) Appl. No.: 12/201,371

(22) Filed: Aug. 29, 2008

(65) Prior Publication Data
US 2010/0052047 A1 Mar. 4, 2010

(51) Int. Cl.
*H01L 29/76* (2006.01)
*H01L 21/06* (2006.01)

(52) U.S. Cl. .................. 438/268; 257/328

(58) Field of Classification Search ......... 257/327–330, 257/492, 493, E29.262; 438/212, 268
See application file for complete search history.

(56) References Cited

U.S. PATENT DOCUMENTS

| | | | |
|---|---|---|---|
| 4,364,073 A | 12/1982 | Becke et al. | |
| 4,941,026 A | 7/1990 | Temple | |
| 6,225,649 B1 | 5/2001 | Minato | |
| 6,737,705 B2 * | 5/2004 | Momota et al. | 257/330 |
| 7,476,931 B2 * | 1/2009 | Schmidt | 257/328 |
| 2007/0138542 A1 | 6/2007 | Schmidt | |
| 2007/0222023 A1 | 9/2007 | Schmidt | |

FOREIGN PATENT DOCUMENTS

| | | |
|---|---|---|
| DE | 10 2005 038 260 B3 | 3/2007 |
| DE | 10 2005 052 733 B3 | 5/2007 |
| DE | 102005052733 B3 | 5/2007 |
| DE | 10 2006 011 637 A1 | 9/2007 |
| EP | 0 616 365 B1 | 9/1994 |

OTHER PUBLICATIONS

M. Allon-Alaluf et al., "Metal contacts and electrical processes in amorphous diamond-like carbon films", Diamond and Related Materials 5 (1996) 1275-1281.
G. Cherkashinin et al., "Mobility edge in hydrogenated amorphous carbon", Appl. Phys. Lett. 88, 172114 (2006).
K. Chew et al., "Gap state distribution in amorphous hydrogenated silicon carbide films deduced from photothermal deflection spectroscopy", Journal Appl. Phys., 2002, vol. 91, No. 7, 4319-4325.
D. Dasgupta et al., "Bands and gap states from optical absorption and electron-spin-resonance studies on amorphous carbon and amorphous hydrogenated carbon films", Phys. Rev. B, 1991, vol. 43, No. 3, 2131-2135.
X.M. He et al., "Investigation of Si-doped diamond-like carbon films synthesized by plasma immersion ion processing", J. Vac. Sci. Tecnol. A 18(5) Sep./Oct. 2000, 2143-2148.

(Continued)

*Primary Examiner* — Calvin Lee
(74) *Attorney, Agent, or Firm* — Dicke, Billig & Czaja, P.L.L.C.

(57) ABSTRACT

The semiconductor device has a semiconductor body with a semiconductor device structure. The semiconductor device structure has a first electrode, a second electrode and a gate electrode. The gate electrode is designed to form a conductive channel region. An insulating layer at least partially surrounds the gate electrode. A semi-insulating layer is provided between the gate electrode and at least one of the first electrode and the second electrode. The semi-insulating layer is located outside the conductive channel region and has an interface state density which is greater than the quotient of the breakdown charge and the band gap of the material of the semiconductor body.

25 Claims, 12 Drawing Sheets

OTHER PUBLICATIONS

J. Kanicki, Amorphous and Micro-crystalline Semiconductor Devices, vol. 2, ed. J. Kanicki, Artech House, Boston (1992).

O. Ozdemir et al., "Frequency dependence of conductivity in intrinsic amorphous silicon carbide film, assessed through admittance measurement of metal insulator semiconductor structure", Thin Solid Films 497 (2006) 149-156.

M. Pollak, "Approximations for the ac Impurity Hopping Conduction", Phys. Rev. A, vol. 133 (Jan. 20, 1964) 564-579.

J. Robertson, "The electronic and atomic structure of hydrogenated amorphous Si-C alloys", Phil. Mag. B, 1992, vol. 66, No. 5, 615-638.

N.F. Mott and E.A. Davies, Electronic Processes in Non-crystalline Materials, Clarendon-Press Oxford, 1979 (textbook-no image available).

S.M. Sze, Physics of Semiconductor Devices 2nd Ed., Wiley, 1981 (textbook).

* cited by examiner

US 7,951,676 B2

SEMICONDUCTOR DEVICE AND METHOD FOR THE PRODUCTION OF A SEMICONDUCTOR DEVICE

BACKGROUND

Owing to their structure, gate-controlled semiconductor devices have parasitic capacitances which limit the switching speed of the semiconductor device in particular in very fast switching processes. In addition, the switching losses of the semiconductor device are co-determined to a great degree by these capacitances, because the parasitic capacitances have to be switched in each switching process together with the gate capacitance. Without the effect of the parasitic capacitances, the switching time of the semiconductor device would be determined by the transit time of the charge carriers through the gate-induced conduction channel, and the transit frequency would lie in the range of 10 GHz. In a real semiconductor device, however, the cut-off frequency is limited to values in the range of 10 MHz due to the parasitic capacitances.

SUMMARY

In one embodiment, a semiconductor device includes a semiconductor body and a cell region with a semiconductor device structure, the semiconductor device structure being provided with a first electrode, a second electrode, a gate electrode and a conductive channel region. An insulating layer at least partially surrounds the gate electrode. In addition, the semiconductor device structure includes a semi-insulating layer between the gate electrode and at least one of the first electrode and the second electrode. The semi-insulating layer is located outside the conductive channel region and includes an interface state density which is greater than the quotient of the breakdown charge and the band gap of the material of the semiconductor body.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
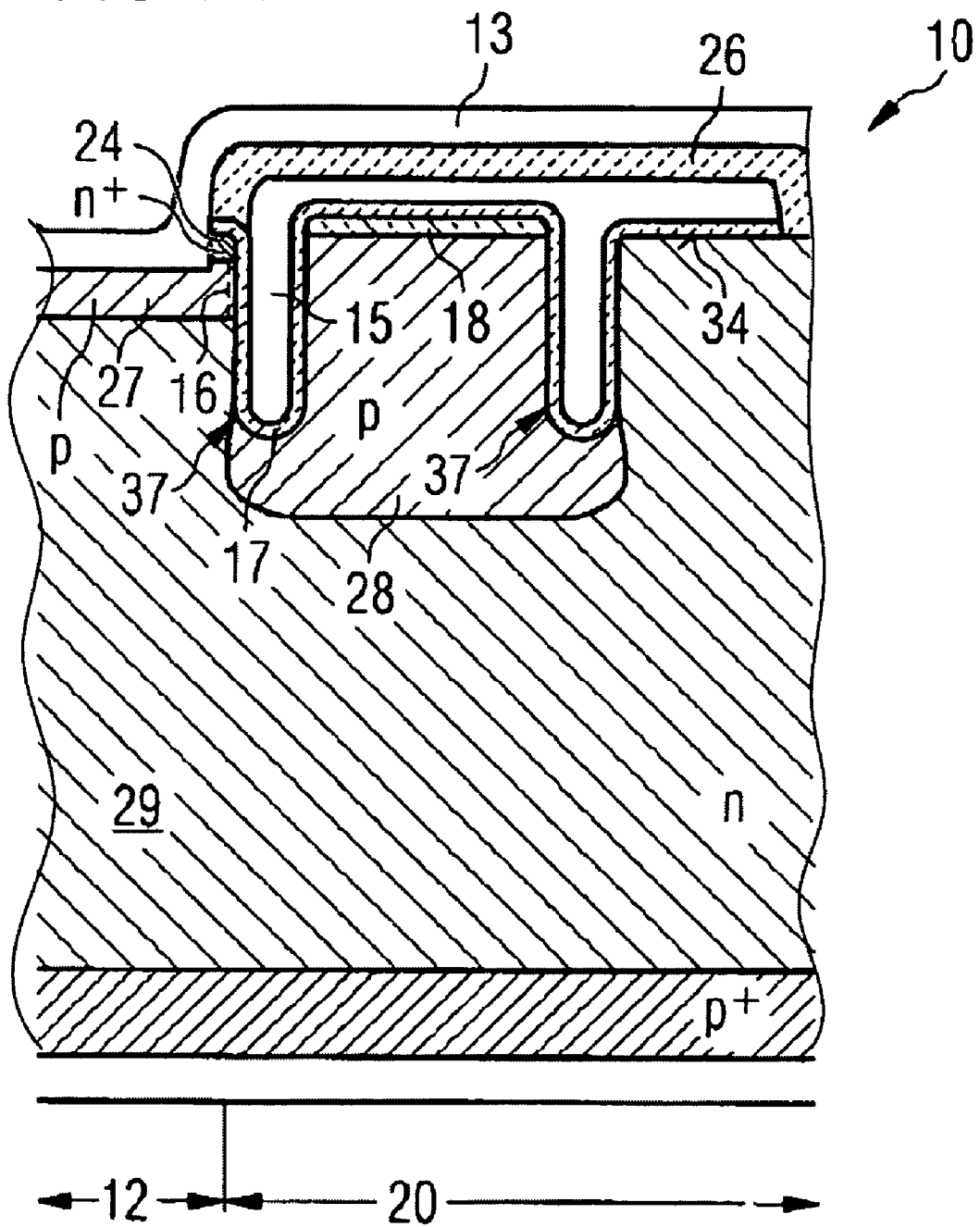
FIGS. 1A and 1B illustrate diagrammatic cross-sections through a section of a semiconductor device.
Figure 1B:
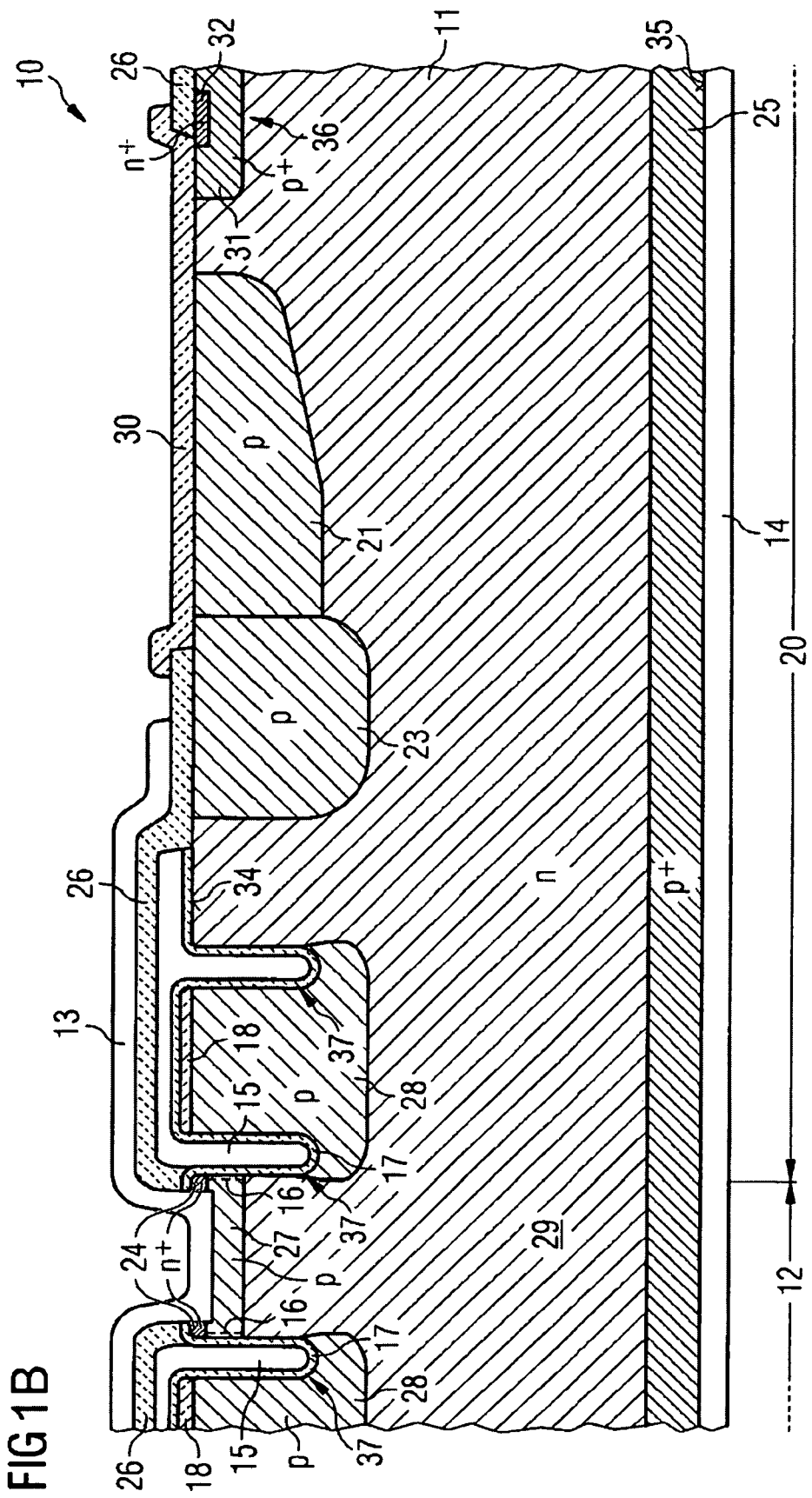

FIGS. 1A and 1B illustrate a diagrammatic cross-section through a section of a semiconductor device 10. In this embodiment, the semiconductor device 10 has a semiconductor body 11 with a first surface 34, which in the illustrated embodiment represents a front-sided surface of the semiconductor body 11, and with a second surface 35 opposite the first surface 34, which in the illustrated embodiment represents a back-sided surface of the semiconductor body 11. A cell region 12 has a semiconductor device structure. The semiconductor device structure includes a first electrode 13, a second electrode 14 and a gate electrode 15. The gate electrode 15 is designed to form a conductive channel region 16 indicated by a broken line. By applying a suitable voltage to the gate electrode 15 and by the associated formation of the conductive channel region 16, the semiconductor device 10 can be switched from a non-conducting state to a conducting state. For this purpose, the gate electrode 15 contains an electrically conductive material, such as a metal or polysilicon. The first electrode 13 is located on the first surface 34 of the semiconductor body 11 and contains an electrically conductive material, typically a metal. Towards the first surface 34, the first electrode 13 is adjoined by an insulating layer 26, which electrically insulates the first electrode 13 from the gate electrode 15. The insulating layer 26 may for example include an oxide. The second electrode 14 is located on the second surface 35 of the semiconductor body 11 and contains an electrically conductive material, typically a metal. In the illustrated embodiment, the gate electrode 15 is a trench gate electrode. For this purpose, at least one trench 37 is provided in the cell region 12. The trench walls and the trench base are covered by an insulating layer 17. The insulating layer 17 may for example include an oxide. The gate electrode 15 is disposed on the insulating layer 17. In this way, the insulating layer 17 surrounds the gate electrode 15 at least partially. In addition, the semiconductor device 10 contains a semi-insulating layer 18. The semi-insulating layer 18 is disposed between the gate electrode 15 and the second electrode 14 outside the conductive channel region 16. In the illustrated embodiment, the semi-insulating layer 18 is located directly on the first surface 34 of the semiconductor body 11. The semi-insulating layer 18 has an interface state density which is greater than the quotient of the breakdown charge and the band gap of the material of the semiconductor body 11.

In the illustrated embodiment, the semiconductor device 10 has a semiconductor device structure for at least one n-channel IGBT (insulated gate bipolar transistor). For this purpose, an n$^+$-doped region 24 providing an emitter region is arranged in a near-surface region of the first surface 34. The n$^+$-doped region 24 is adjoined in the vertical direction towards the second surface 35 by a p-doped body zone 27. The first electrode 13 electrically contacts both the body zone 27 and the emitter region.

In the vertical direction towards the second surface 35, the body zone 27 is adjoined by an n-doped drift zone 29. A p$^+$-doped layer 25 in a near-surface region of the second surface 35 provides a collector region. The collector region is electrically contacted via the second electrode 14.

The p$^+$-doped layer 25 serves as a source for p-type charge carriers and thus provides the bipolar behaviour of the semiconductor device 10. Floating p-doped regions 28 between two adjacent trenches 37 outside the body zone 27 and the drift zone 29 provide a damming effect for the p-type charge carriers before the leaking-away via the p-doped body zone 27, thereby improving the behaviour of the semiconductor device 10 in the conducting state without affecting its latch-up resistance.

The semi-insulating layer 18 between the second electrode 14 and the gate electrode 15 effects a reduction of the gate-collector capacitance, which is also known as Miller capacitance, and thereby improved switching characteristics of the semiconductor device 10 with a faster switching process and reduced switching losses. Owing to the high shielding capability of the semi-insulating layer 18, charges are built up which prevent the punch-through of the collector potential to the gate electrode 15. As a result of the provision of the semi-insulating layer 18, a thick insulating layer in high-voltage resistant semiconductor devices between the floating regions 28 and the gate electrode 15 may be omitted.

The semi-insulating layer 18 may contain a material with a band gap which is greater than the band gap of the material of the semiconductor body 11.

In the illustrated embodiment, the semi-insulating layer 18 is located adjacent to the insulating layer 17. This avoids a current flow between the semiconductor body 11 and the gate electrode 15 via the semi-insulating layer 18, which may for example have a resistivity in the range of $10^{12}$ Ωcm.

The semi-insulating layer 18 may for example contain an amorphous material, typically amorphous carbon. Alternatively, the semi-insulating layer 18 may contain a hydrogenated amorphous carbon, which may further be doped with silicon. In a further embodiment, the semi-insulating layer 18 may contain amorphous silicon. Amorphous silicon carbide can also be provided as a material for the semi-insulating layer 18. In addition, the semi-insulating layer 18 may contain semi-insulating polysilicon (SIPOS).

Silicon is typically provided as a material for the semiconductor body 11. In addition, silicon carbide or a material from a III/V semiconductor, such as GaAs, may be provided.

In addition to the cell region 12, the illustrated embodiment of the semiconductor device 10 includes an adjoining edge region 20, which encloses the cell region 12 and extends to the edge of the semiconductor body 11. The cell region 12 is also referred to as an active cell region, while the edge region 20 is also referred to as an inactive edge region. In the edge region 20 surrounding the cell region 12, at least one variably laterally doped doping material zone (VLD zone) 21 may be provided. The VLD zone has a p-doping which is reduced laterally towards the edge of the semiconductor body 11 to the concentration of doping material of the drift zone 29. As a result, the electric field strength is reduced in the non-conducting state of the semiconductor device 10 in the edge region 20, where a p-n junction of the semiconductor device structure reaches the first surface 34 such that a moderate field distribution is obtained and a premature breakthrough of the semiconductor device 10 under blocking load is avoided.

In a non-illustrated embodiment, at least one guard ring or at least one field plate is provided in the edge region 20 of the semiconductor device 10. In addition, combinations of VLD zone 21, guard ring and field plate may be provided.

The edge region 20 may further include a channel stopper 36. The channel stopper 36 is used to limit the depletion region at the outer edge of the semiconductor device 10 when the p-n junction is reverse-biased. For this purpose, the channel stopper 36 includes in a near-surface region of the first surface 34 a p$^-$-doped region 31 and an n$^+$-doped region 32 completely contained within the p$^+$-doped region 31, whereby the outermost edge of the semiconductor device 10 can be set at collector potential.

In addition, a p-doped region 23 is provided in a near-surface region of the first surface 34 as a terminal region of the emitter region.

The semiconductor device 10 may contain a semi-insulating layer 30 in the edge region 20, the said semi-insulating layer 30 being located on the VLD zone 21 and at least partially on the p-doped region 23 and the channel stopper 36. The semi-insulating layer 30 acts as a passivation layer to protect the first surface 34 in the edge region 20 against external charges which could have an adverse effect on the blocking behaviour of the semiconductor device 10. The material for the semi-insulating layer 30 is typically identical to that of the semi-insulating layer 18.

In addition to the illustrated semiconductor device structure for at least one n-channel IGBT, in a non-illustrated embodiment, the semiconductor device 10 has a semiconductor device structure for at least one p-channel IGBT. In this case, the doping of the individual regions of the p-channel IGBT complements the doping of the corresponding regions of the n-channel IGBT.

The semiconductor device 10 may be a power semiconductor device irrespective of whether it has a semiconductor device structure for at least one n-channel IGBT or for at least one p-channel IGBT.

A method for the production of a semiconductor device 10 with a semiconductor body 11 includes the following process processes. In an initial process, a semiconductor device structure with a first electrode 13, a second electrode 14 and a gate electrode 15 in a cell region 12 is produced. The gate electrode 15 is at least partially surrounded by an insulating layer 17. A semi-insulating layer 18 is produced between the gate electrode 15 and the second electrode 14 outside a conductive channel region 16 of the gate electrode 15, for instance directly on a first surface 34 of the semiconductor body 11. For the semi-insulating layer 18, a material with an interface state density which is greater than the quotient of the breakdown charge and the band gap of the material of the semiconductor body 11 is used.

The semi-insulating layer 18 may be produced in a CVD process (chemical vapour deposition). Plasma enhanced CVD is particularly suitable. The materials referred to above can be used as materials for the semi-insulating layer 18. To produce a semi-insulating layer 18 from hydrogenated amorphous carbon, which may either be non-doped or doped with silicon, precursor gases such as silane or methane can be used. These allow for a very high interface state density of the semi-insulating layer 18.

The introduction of hydrogen results in a saturation of free valences. In addition, the relative gas flows of, for example, methane and silane permit the setting of any mix ratio between silicon and carbon in a semi-insulating layer 18 with hydrogenated amorphous carbon doped with silicon. The silicon doping supports the stress relief and increases the density and the optical band gap of the material. As more silicon is introduced, the specific conductivity of the material is reduced as well.

In a further embodiment, the semi-insulating layer 18 is produced in a PVD process (physical vapour deposition), for instance by evaporation, sputtering, ion beam deposition or pulsed laser deposition.

In a further process process, an edge structure may be produced in an edge region 20 surrounding the cell region 12. The structures referred to above, for example a VLD zone 21 and a channel stopper 36, can be provided as edge structures.

FIGS. 2 to 11 illustrate diagrammatic cross-sections through sections of further semiconductor devices. Components of the same function as those in FIG. 1 are identified by the same reference numbers and not explained again below.

The switching characteristics of the semiconductor device 10 listed above, provided by the semi-insulating layer 18, are also illustrated by the semiconductor devices of the following embodiments and will not be listed again to avoid repetition.

Figure 2:
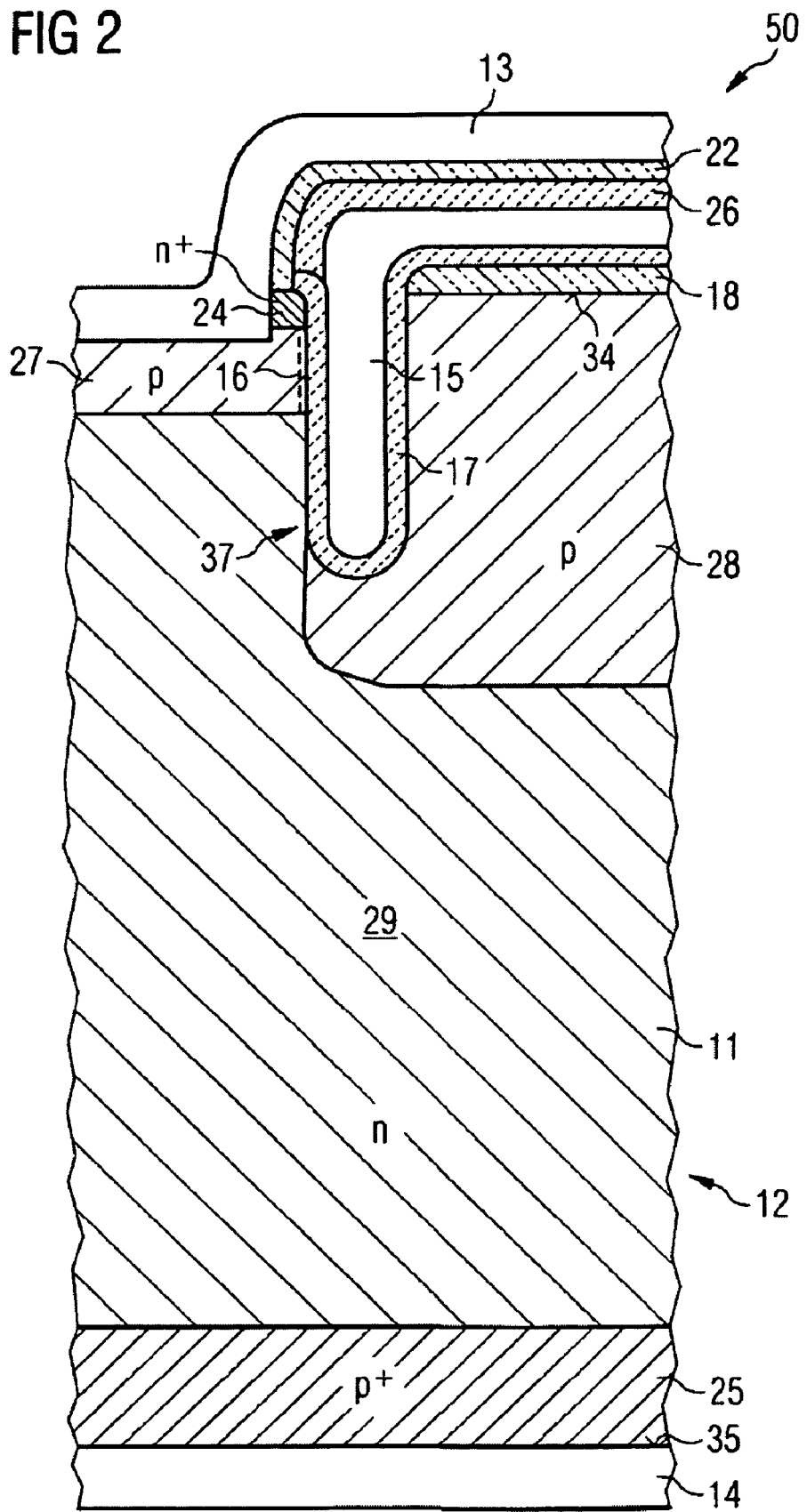
FIG. 2 illustrates a diagrammatic cross-section through a section of a semiconductor device.

FIG. 2 illustrates a diagrammatic cross-section through a section of a semiconductor device 50.

FIG. 2 illustrates a section of a cell region 12 of the semiconductor device 50. The semiconductor device 50 may further include an edge region surrounding the cell region 12, which may be analogous to the edge region 20 of the semiconductor device 10 illustrated in FIG. 1.

In addition to a first semi-insulating layer 18, the semiconductor device 50 is provided with a further semi-insulating layer 22, this further semi-insulating layer 22 being located between the gate electrode 15 and the first electrode 13, which provides an emitter electrode in the illustrated embodiment. In the illustrated embodiment, the semi-insulating layer 22 is arranged adjacent to the first electrode 13 and an insulating layer 26.

The semiconductor device 50 differs from the semiconductor device 10 in that semi-insulating layers 18 and 22 respectively are provided both between the gate electrode 15 and the second electrode 14 and between the gate electrode 15 and the first electrode 13 outside the conductive channel region 16.

The further semi-insulating layer 22 reduces the gate-emitter capacitance, resulting in a further reduction of the switching time of the semiconductor device 50 and in lower switching losses.

Figure 3:
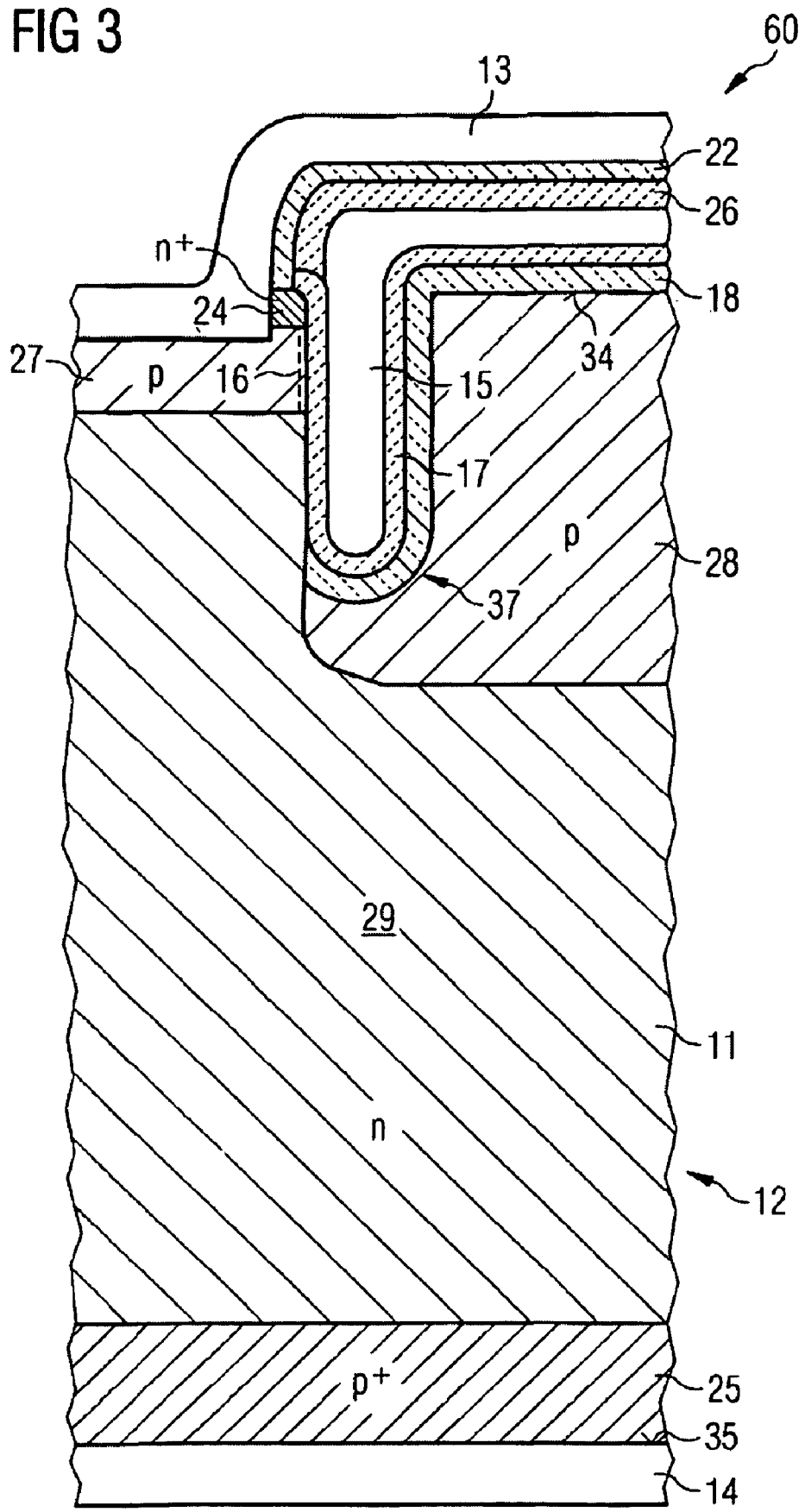
FIG. 3 illustrates a diagrammatic cross-section through a section of a semiconductor device.

FIG. 3 illustrates a diagrammatic cross-section through a section of a semiconductor device 60.

In this embodiment, the semiconductor device 60 contains a first semi-insulating layer 18 and a second semi-insulating layer 22. It differs from the semiconductor devices 10 and 50 illustrated in FIGS. 1 and 2 in that the first semi-insulating layer 18 is provided both on the first surface 34 of the semiconductor body 11 and partially in the trench 37. The semi-insulating layer 18 is arranged such that it remains outside the conductive channel region 16.

By extending the semi-insulating layer 18 into the trench 37 in the vicinity of the edge of the conductive channel region 16, the shielding of the gate electrode 15 by the semi-insulating layer 18 is enhanced.

In a non-illustrated embodiment, the semiconductor device 60 may only be provided with the first semi-insulating layer 18 in the cell region 12.

Figure 4:
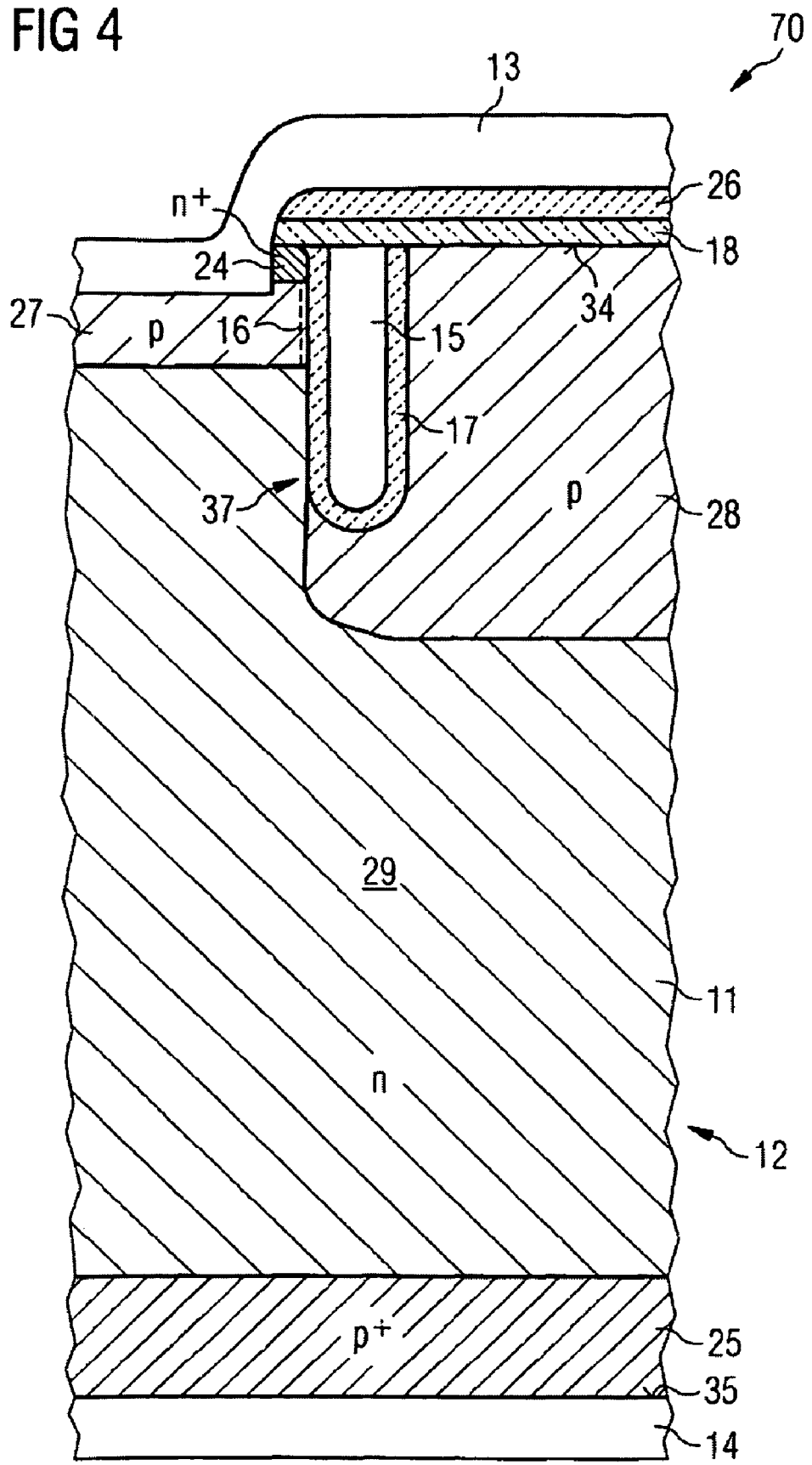
FIG. 4 illustrates a diagrammatic cross-section through a section of a semiconductor device.

FIG. 4 illustrates a diagrammatic cross-section through a section of a semiconductor device 70.

In this embodiment, the semiconductor device 70 has a strip-shaped semi-insulating layer 18 between the gate electrode 15 and the first electrode 13. In the illustrated embodiment, the semi-insulating layer 18 is arranged directly on the first surface 34 of the semiconductor body 11 and adjacent to the insulating layer 26. The use of a strip-shaped design for the semi-insulating layer 18 facilitates the installation of the layer within the semiconductor device 70.

Figure 5:
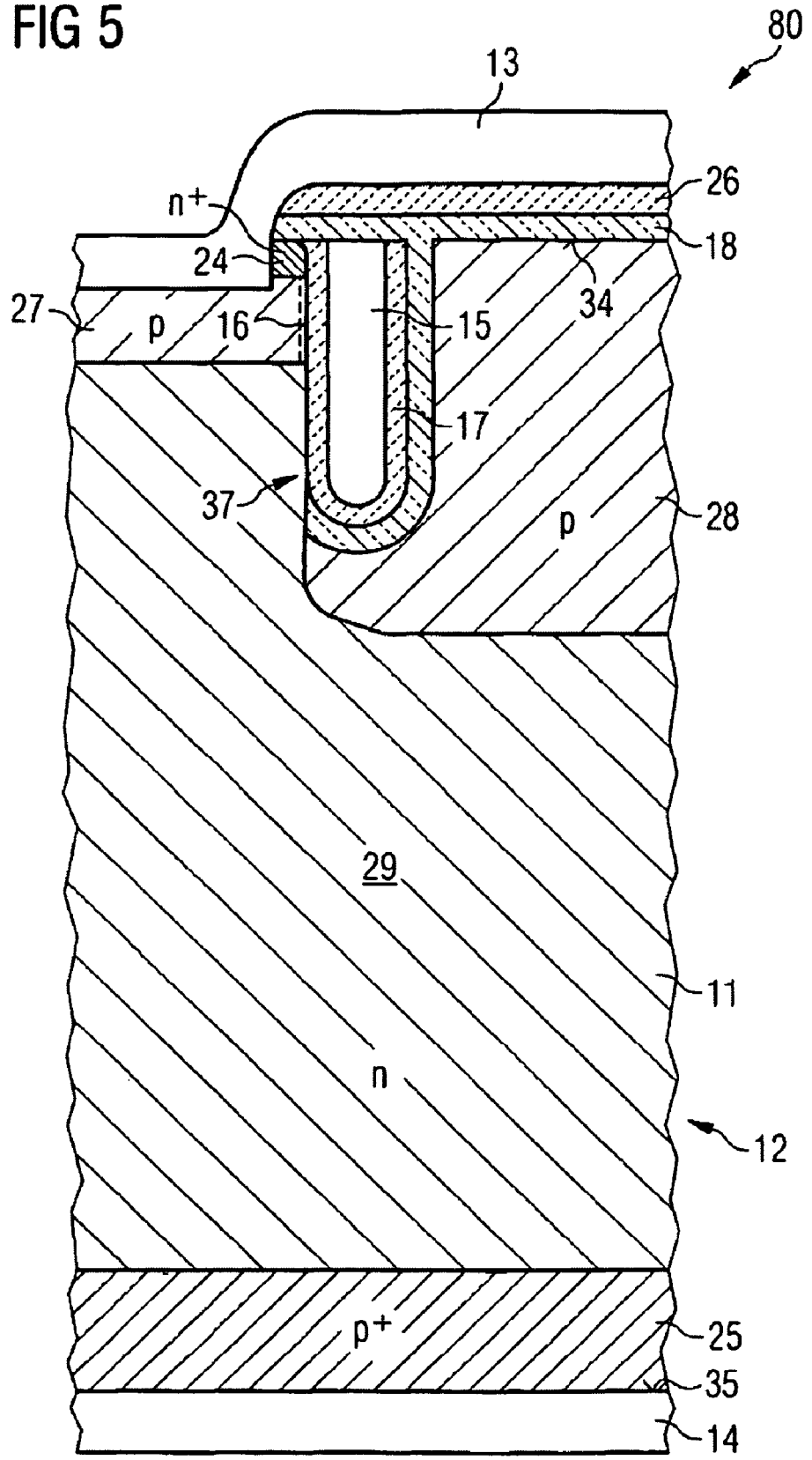
FIG. 5 illustrates a diagrammatic cross-section through a section of a semiconductor device.

FIG. 5 illustrates a diagrammatic cross-section through a section of a semiconductor device 80.

The semiconductor device 80 illustrated in FIG. 5 differs from the semiconductor device 70 illustrated in FIG. 4 in that the semi-insulating layer 18 is provided both on the first surface 34 of the semiconductor body 11 and partially in the trench 37.

As explained in the context of the semiconductor device 60 illustrated in FIG. 3, this allows for the utilisation of the shielding effect of the semi-insulating layer 18 in the region of the trench 37.

For the individual components of the semiconductor devices 50 to 80 illustrated in FIGS. 2 to 5, for example for the semi-insulating layers 18 and 22, the materials described in the context of the semiconductor device 10 illustrated in FIG. 1 can be used.

Figure 6:
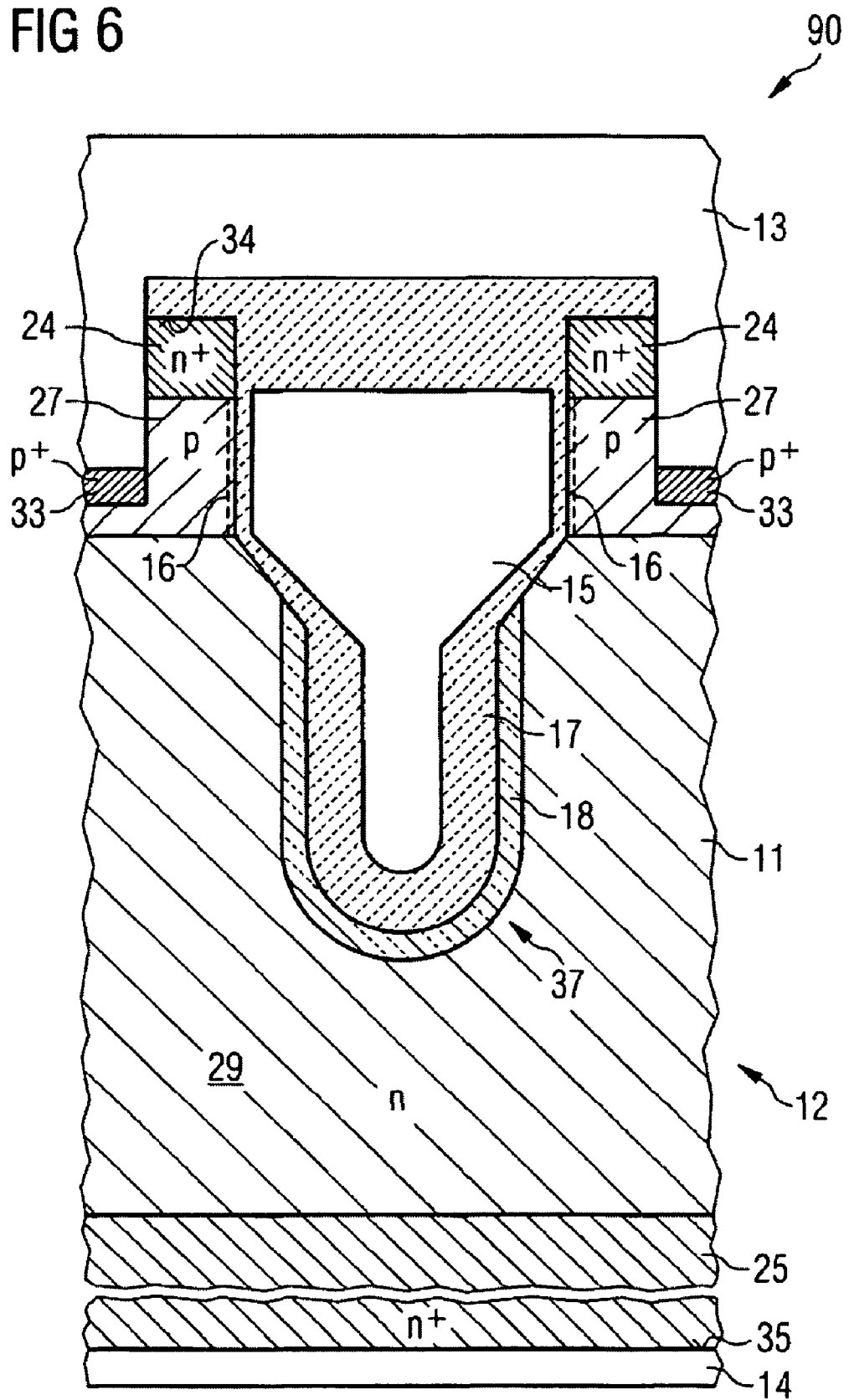
FIG. 6 illustrates a diagrammatic cross-section through a section of a semiconductor device.

FIG. 6 illustrates a diagrammatic cross-section through a section of a semiconductor device 90.

The semiconductor device 90 has a semiconductor device structure for at least one n-channel MOSFET. For this purpose, the semiconductor device 90 has a first electrode 13 providing a source electrode, a second electrode 14 providing a drain electrode and a gate electrode 15. The gate electrode 15 of the illustrated embodiment is a trench gate electrode. The semiconductor device 90 further includes in a near-surface region of the first surface 34 an $n^+$-doped region 24 acting as a source region and in a near-surface region of the second surface 35 an $n^+$-doped region 25 acting as a drain region.

A $p^-$-doped region 33 partially disposed between the first electrode 13 and a body zone 27 reduces the contact resistance between the first electrode 13 and the body zone 27.

In a near-surface region of the first surface 34, the gate electrode 15 is designed to form a conductive channel region 16. In this region, the insulating layer 17 has a thickness which is reduced compared to the thickness of the insulating layer 17 in the other regions. If the insulating layer 17 is made of an oxide, this region of the insulating layer 17 is also identified as a gate oxide. By applying a positive voltage to the gate electrode 15 and the associated formation of an n-type conductive channel region 16 in an edge region of the body zone 27 located adjacent to the gate electrode 15, the semiconductor device 90 can be switched from a non-conducting state to a conducting state. For this purpose, the gate electrode 15 contains an electrically conductive material, such as a metal or polysilicon.

In a region which lies at a vertically lower level with respect to the first surface 34, the width of the gate electrode 15 is reduced. In this region, the gate electrode 15 provides a field plate, thus providing the lateral depletion of the drift zone 29 in the non-conducting state of the semiconductor device 90. The lateral voltage drop occurs via the insulating layer 17 in the region of the base of the trench 37, where the thickness is increased compared to the thickness of the insulating layer 17 in the conductive channel region 16. If the insulating layer 17 is made of an oxide, it is identified as a field oxide in this region.

A semi-insulating layer 18 is provided in the region of the wall of the trench 37 outside the conductive channel region 16. The semi-insulating layer 18 effects a reduction of the gate-drain capacitance, thus improving the switching characteristics of the semiconductor device 90 in terms of switching time and switching losses. As a result, a single electrode may be provided rather than dividing the gate electrode 15 into an upper region and a lower region, the latter serving as a field plate.

Figure 7:
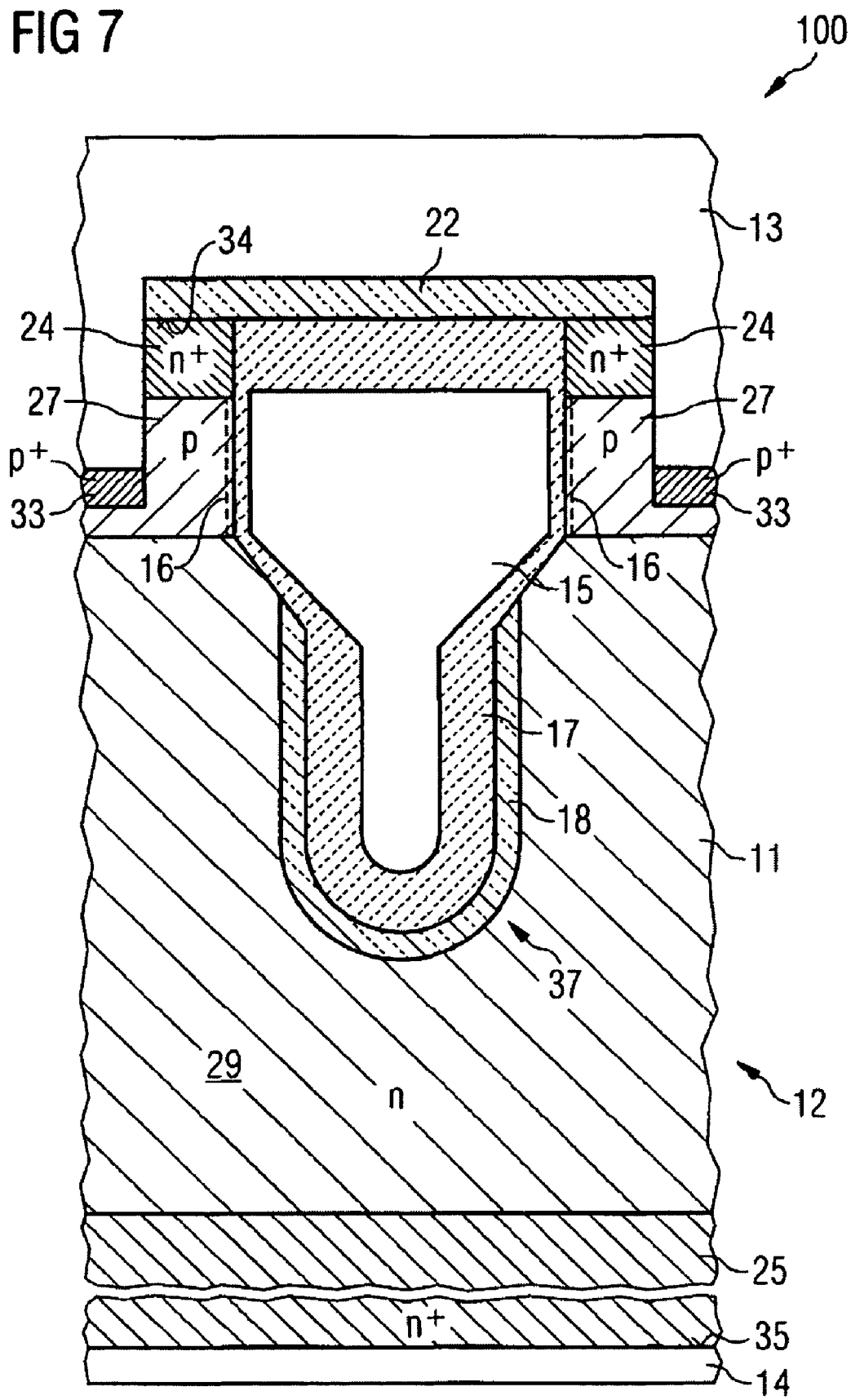
FIG. 7 illustrates a diagrammatic cross-section through a section of a semiconductor device.

FIG. 7 illustrates a diagrammatic cross-section through a section of a semiconductor device 100.

The semiconductor device 100 of this embodiment has a semiconductor device structure for at least one n-channel MOSFET similar to the semiconductor device 90 illustrated in FIG. 6. In addition to the semi-insulating layer 18, the semiconductor device 100 has a further semi-insulating layer 22 located between the gate electrode 15 and the first electrode 13, which is a source electrode in the illustrated embodiment. In the illustrated embodiment, the semi-insulating layer 22 is located adjacent to the first electrode 13 and a region of the insulating layer 17 disposed in the vertical direction relative to the first surface 34 of the semiconductor body 11 above the region of the insulating layer 17 which is a gate oxide. This region of the insulating layer 17 is also identified as intermediate oxide if the insulating layer 17 is made of an oxide. The semi-insulating layer 22 reduces the gate-source capacitance and thus contributes to improved switching characteristics of the semiconductor device 100.

In addition to the semiconductor device structure for at least one n-channel MOSFET as illustrated in FIGS. 6 and 7, in a non-illustrated embodiment, the semiconductor device has a semiconductor device structure for at least one p-channel MOSFET. In this case, the doping of the individual regions of the p-channel MOSFET complements the doping of the corresponding regions of the n-channel MOSFET.

The semiconductor devices illustrated in FIGS. 3 to 7 may further include an edge region 20 surrounding the cell region 12, wherein the edge structures referred to in the context of the semiconductor device 10 may be located.

Figure 8:
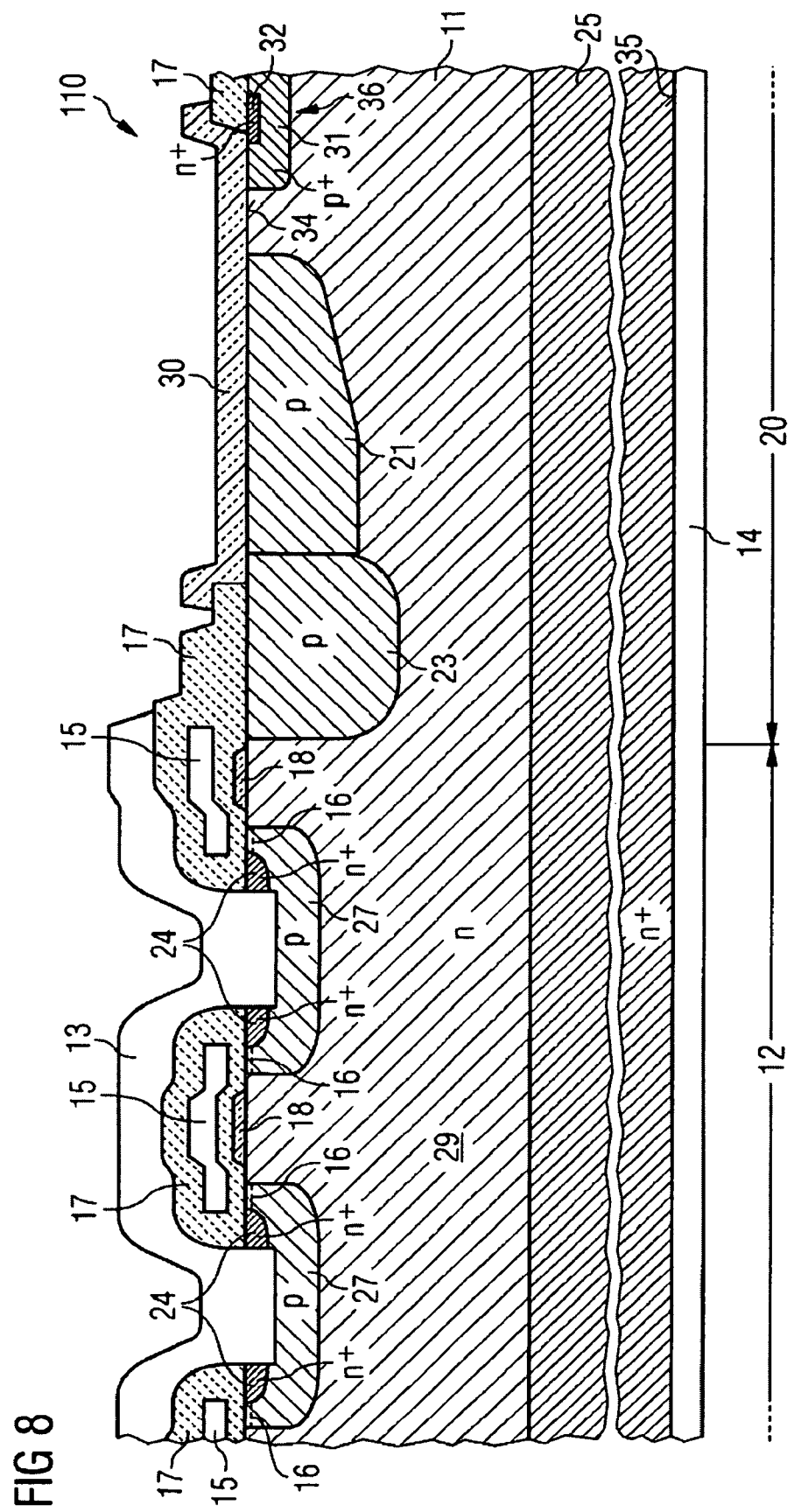
FIG. 8 illustrates a diagrammatic cross-section through a section of a semiconductor device.

FIG. 8 illustrates a diagrammatic cross-section through a section of a semiconductor device 110.

The semiconductor device 110 illustrated in FIG. 8 has a semiconductor device structure for at least one n-channel MOSFET. It differs from the semiconductor devices illustrated in FIGS. 1 to 7 in that the gate electrode 15 is disposed laterally on the first surface 34 of the semiconductor body 11. This gives the semiconductor device 110 a planar cell structure.

The gate electrode 15 is at least partially surrounded by an insulating layer 17. The insulating layer 17 electrically insulates the gate electrode 15 against the first electrode 13 and the semiconductor body 11.

A semi-insulating layer 18 is disposed between the gate electrode 15 and the second electrode 14 outside a conductive channel region 16. In the illustrated embodiment, the semi-insulating layer 18 is provided directly on the first surface 34 of the semiconductor body 11 and between the semiconductor body 11 and the insulating layer 17. The semi-insulating layer 18 reduces the gate-drain capacitance and thus contributes to improved switching characteristics of the semiconductor device 110, as has been explained in the context of the semiconductor devices with a trench gate structure as illustrated in FIGS. 1 to 7.

The semiconductor device 110 may further include an edge region 20 surrounding the cell region 12, where a VLD zone 21 and a channel stopper 36 are provided in the illustrated embodiment. The edge region 20 may further accommodate the other edge structures mentioned in the context of the semiconductor device 10.

In addition to the semiconductor device structure for at least one n-channel MOSFET, in a non-illustrated embodiment, the semiconductor device 110 has a semiconductor device structure for at least one p-channel MOSFET. In this case, the doping of the individual regions of the p-channel MOSFET complements the doping of the corresponding regions of the n-channel MOSFET.

Figure 9:
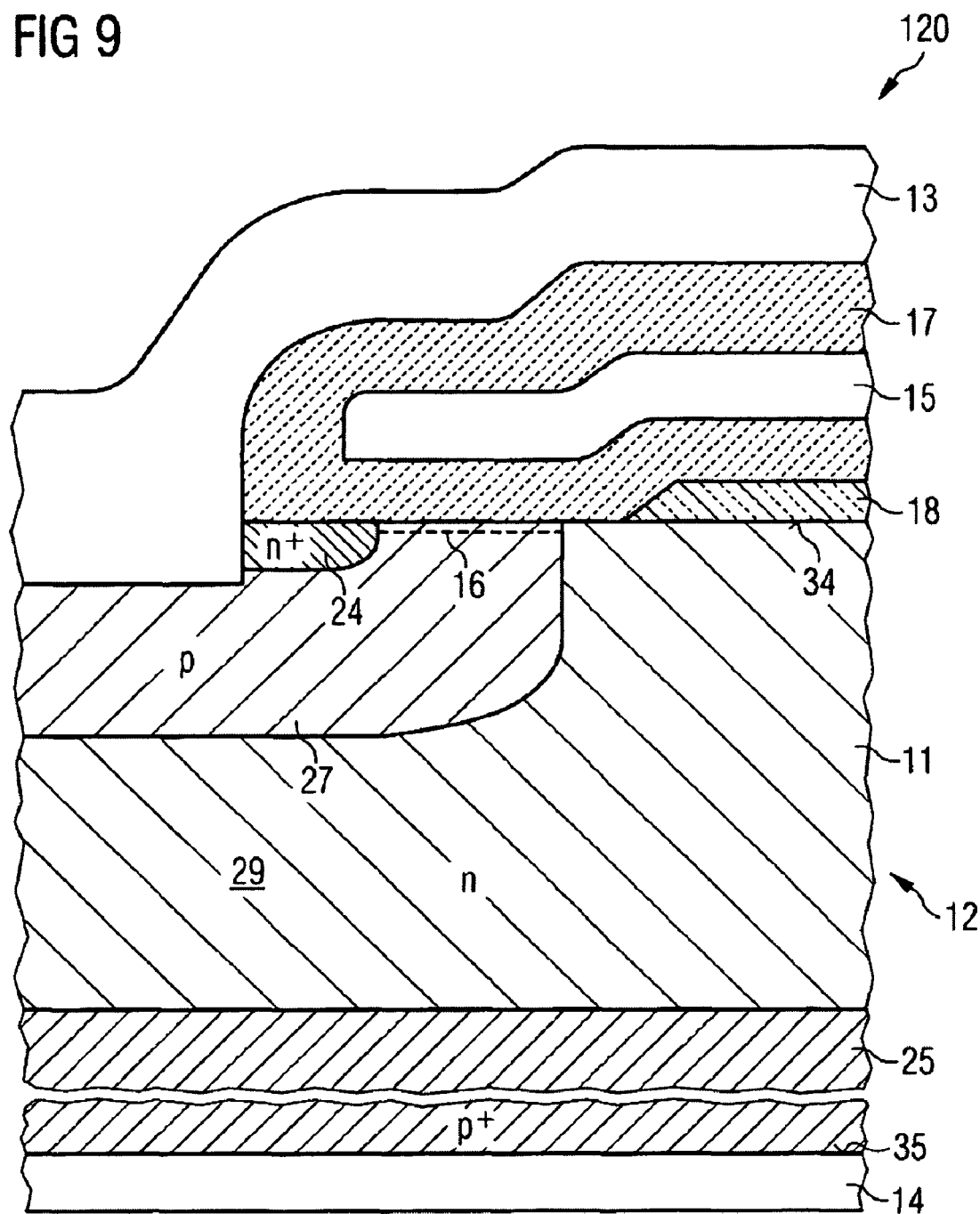
FIG. 9 illustrates a diagrammatic cross-section through a section of a semiconductor device.

FIG. 9 illustrates a diagrammatic cross-section through a section of a semiconductor device 120.

The semiconductor device 120 differs from the semiconductor device 110 illustrated in FIG. 8 in that it has a semiconductor device structure for an n-channel IGBT. For this purpose, a $p^+$-doped layer 25 is provided in a near-surface region of the second surface 35. In terms of switching characteristics, the semiconductor device 120 resembles the semiconductor device 110; for this reason these are not explained again to avoid repetition.

In addition to the illustrated semiconductor device structure for at least one n-channel IGBT, in a non-illustrated embodiment, the semiconductor device 120 has a semiconductor device structure for at least one p-channel IGBT. In this case, the doping of the individual regions of the p-channel IGBT complements the doping of the corresponding regions of the n-channel IGBT.

Figure 10:
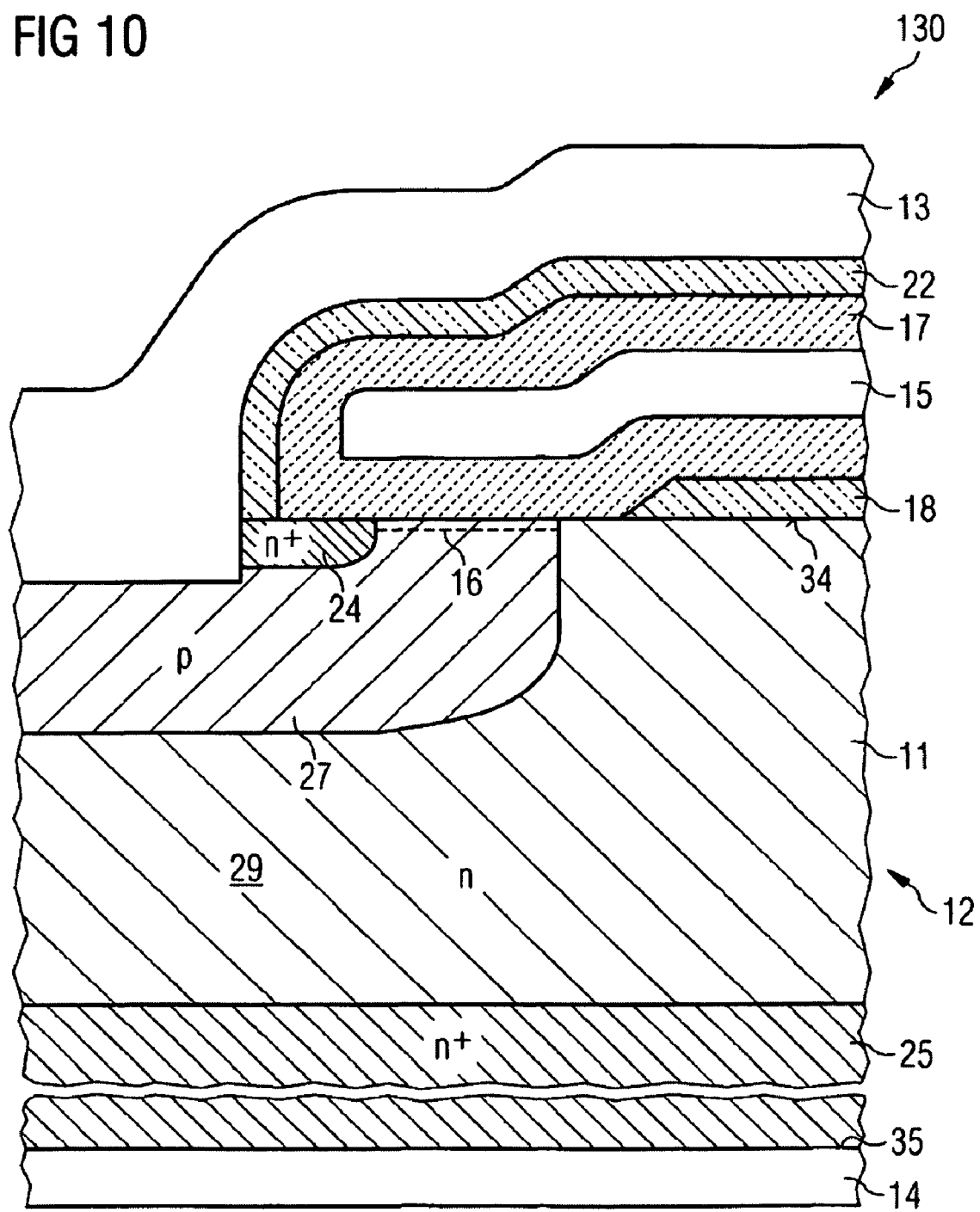
FIG. 10 illustrates a diagrammatic cross-section through a section of a semiconductor device.

FIG. 10 illustrates a diagrammatic cross-section through a section of a semiconductor device 130.

The semiconductor device 130 differs from the semiconductor device 110 illustrated in FIG. 8 in that a second semi-insulating layer 22 is provided between the gate electrode 15 and the first electrode 13 in addition to the semi-insulating layer 18. In the illustrated embodiment, the second semi-insulating layer 22 is located adjacent to the first electrode 13 and the insulating layer 17 and reduces the gate-source capacitance, thereby improving the switching characteristics of the semiconductor device 130.

In a non-illustrated embodiment, the semiconductor device 130 has a semiconductor device structure for at least one IGBT, which may be an n-channel IGBT or a p-channel IGBT.

Figure 11:
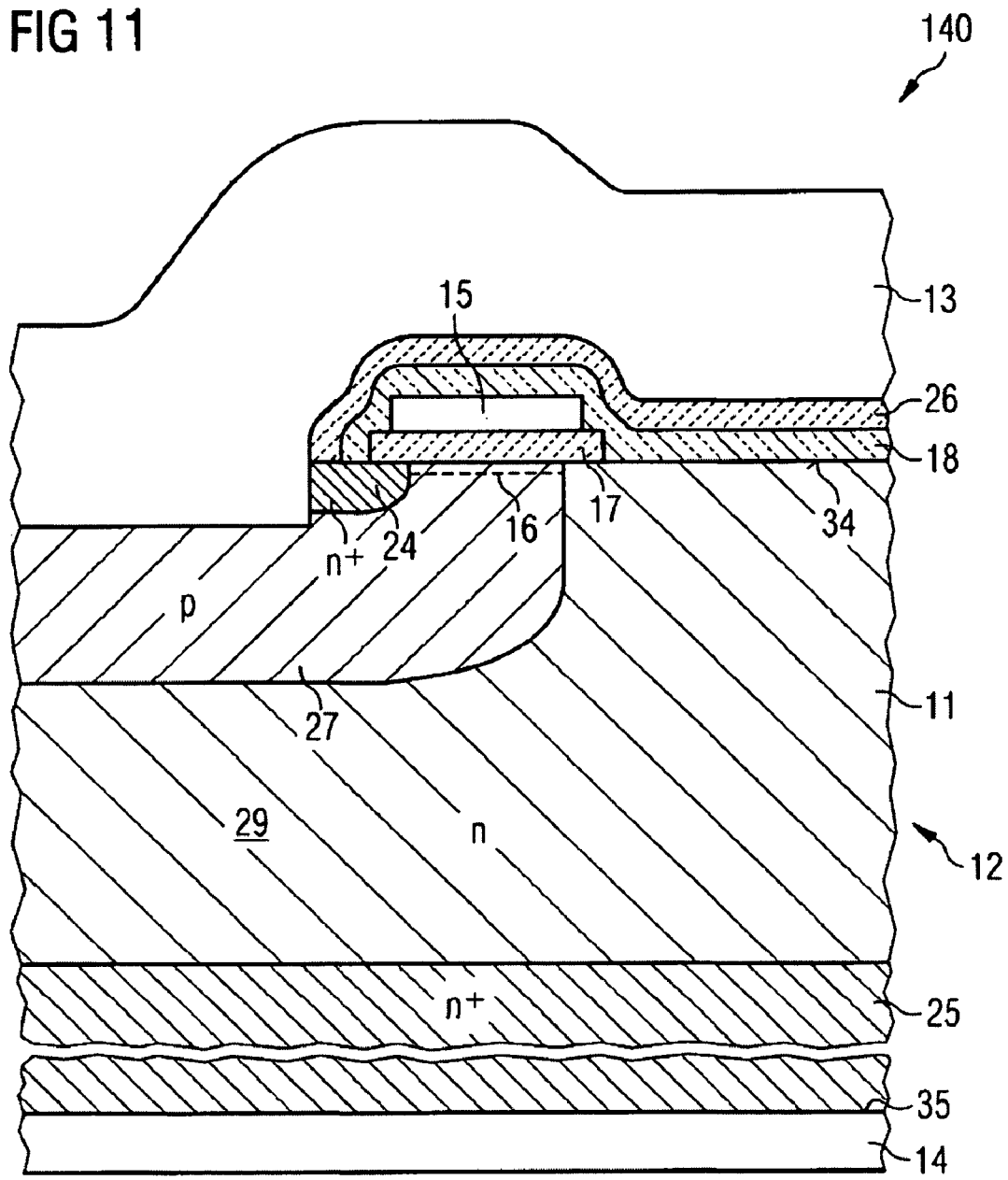
FIG. 11 illustrates a diagrammatic cross-section through a section of a semiconductor device.

FIG. 11 illustrates a diagrammatic cross-section through a section of a semiconductor device 140.

The semiconductor device 140 differs from the semiconductor devices 110 and 130 illustrated in FIGS. 8 and 10 respectively in that the gate electrode 15 is arranged strip-shaped in the lateral direction and in that, in addition to a first insulating layer 17 between the gate electrode 15 and the first surface 34 of the semiconductor body 11, a further insulating layer 26 is provided between the first electrode 13 and the gate electrode 15.

Between the second insulating layer 26 and the gate electrode 15 and between the second insulating layer 26 and the first surface 34 of the semiconductor body 11, respectively, a semi-insulating layer 18 is provided in the illustrated embodiment.

As a result of the provision of the semi-insulating layer 18 both between the gate electrode 15 and the first electrode 13 and between the gate electrode 15 and the semiconductor body 11, the semi-insulating layer 18 reduces both the gate-source capacitance and the gate-drain capacitance. The use of a strip-shaped arrangement of the individual cell regions 12 allows for a simplified structure of the semiconductor device 140.

In addition to the semiconductor device structures for at least one n-channel MOSFET as illustrated in FIGS. 10 and 11, in a non-illustrated embodiment, the semiconductor device has a semiconductor device structures for at least one p-channel MOSFET. In this case, the doping of the individual regions of the p-channel MOSFET complements the doping of the corresponding regions of the n-channel MOSFET.

In a non-illustrated embodiment, the semiconductor device 140 has a semiconductor device structure for at least one IGBT, which may be an n-channel IGBT or a p-channel IGBT.

The materials of the individual components of the semiconductor devices 110 to 140 illustrated in FIGS. 8 to 11 may be the same as the materials of the corresponding components of the semiconductor devices illustrated in FIGS. 1 to 7.

The semiconductor devices 120 to 140 illustrated in FIGS. 9 to 11 may moreover include an edge region 20 surrounding the cell region 12, where the edge structures referred to in the context of the semiconductor device 10 may be located.

The semiconductor devices illustrated in FIGS. 2 to 11 may for example be power semiconductor devices.

The semiconductor devices illustrated in FIGS. 2 to 11 can further be produced using the method described for the semiconductor device 10, wherein the second semi-insulating layer 22 of the relevant embodiments is produced between the gate electrode 15 and the first electrode 13 outside the conductive channel region 16 of the gate electrode 15, for instance adjacent to the first electrode 13 and an insulating layer. For the semi-insulating layer 22, a material with an interface state density which is greater than the quotient of the breakdown charge and the band gap of the material of the semiconductor body 11 is used. The material for the semi-insulating layer 18 is typically used for the semi-insulating layer 22 as well.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for the production of a semiconductor device with a semiconductor body, the method comprising:
   producing a first electrode, a second electrode and a gate electrode in a cell region of a semiconductor device structure;
   at least partially surrounding the gate electrode by an insulating layer; and
   producing a semi-insulating layer of a material including an interface state density which is greater than the quotient of the breakdown charge and the band gap of the material of the semiconductor body between the gate electrode and at least one of the first electrode and the second electrode outside a conductive channel region of the gate electrode.

2. The method of claim 1, wherein an edge structure is produced in an edge region surrounding the cell region.

3. The method of claim 1, wherein the semi-insulating layer is produced in a chemical vapor deposition process.

4. A semiconductor device comprising:
   a semiconductor body,
   a cell region with a semiconductor device structure comprising:
      a first electrode;
      a second electrode;
      a gate electrode;
      a conductive channel region;
      an insulating layer, wherein the insulating layer at least partially surrounds the gate electrode;
      a semi-insulating layer between the gate electrode and at least one of the first electrode and the second electrode; and
      wherein the semi-insulating layer is located outside the conductive channel region and includes an interface state density which is greater than the quotient of the breakdown charge and the band gap of the material of the semiconductor body.

5. The semiconductor device according to claim 4, wherein the semi-insulating layer includes a material with a band gap which is greater than the band gap of the material of the semiconductor body.

6. The semiconductor device of claim 4, wherein the semi-insulating layer is located adjacent to the insulating layer.

7. The semiconductor device of claim 4, wherein the material of the semiconductor body includes silicon.

8. The semiconductor device of claim 4, wherein the semi-insulating layer includes an amorphous material.

9. The semiconductor device of claim 4, wherein the semi-insulating layer includes amorphous carbon.

10. The semiconductor device of claim 4, wherein the semi-insulating layer includes hydrogenated amorphous carbon.

11. The semiconductor device of claim 4, wherein the semi-insulating layer includes silicon doped hydrogenated amorphous carbon.

12. The semiconductor device of claim 4, wherein the semi-insulating layer includes amorphous silicon.

13. The semiconductor device of claim 4, wherein the semi-insulating layer includes amorphous silicon carbide.

14. The semiconductor device of claim 4, wherein the semi-insulating layer includes semi-insulating polysilicon.

15. The semiconductor device of claim 4, wherein the insulating layer includes an oxide.

16. The semiconductor device of claim 4, wherein the gate electrode is a trench gate electrode.

17. The semiconductor device of claim 4, wherein at least one field plate is provided in the cell region.

18. The semiconductor device of claim 4, wherein the semiconductor device is a power semiconductor device.

19. The semiconductor device of claim 4, wherein at least one variably laterally doped doping material zone (VLD zone) is provided in an edge region surrounding the cell region.

20. The semiconductor device of claim 4, wherein at least one guard ring is provided in an edge region surrounding the cell region.

21. The semiconductor device of claim 4, wherein at least one field plate is provided in an edge region surrounding the cell region.

22. The semiconductor device of claim 4, wherein a channel stopper is provided in an edge region surrounding the cell region.

23. The semiconductor device of claim 4, wherein the cell region includes a semiconductor device structure for at least one MOSFET.

24. The semiconductor device of claim 4, wherein the cell region includes a semiconductor device structure for at least one IGBT.

25. The semiconductor device of claim 4, wherein the semi-insulating layer is provided between the gate electrode and the second electrode outside the conductive channel region and a further semi-insulating layer is provided between the gate electrode and the first electrode outside the conductive channel region.

* * * * *

UNITED STATES PATENT AND TRADEMARK OFFICE
CERTIFICATE OF CORRECTION

| | | |
|---|---|---|
| PATENT NO. | : 7,951,676 B2 | Page 1 of 1 |
| APPLICATION NO. | : 12/201371 | |
| DATED | : May 31, 2011 | |
| INVENTOR(S) | : Gerhard Schmidt | |

It is certified that error appears in the above-identified patent and that said Letters Patent is hereby corrected as shown below:

Title page, item [56] Col 2, line 2 under FOREIGN PATENT DOCUMENTS the fourth reference listed delete:

"DE 10 2006 011 637 A1" and insert in place thereof
-- DE 10 2006 011 697 A1 --.

Signed and Sealed this
Twenty-ninth Day of November, 2011

David J. Kappos
*Director of the United States Patent and Trademark Office*